United States Patent [19]
Aono et al.

[11] Patent Number: 5,654,098
[45] Date of Patent: Aug. 5, 1997

[54] SUPERCONDUCTING WIRE AND COMPOSITE SUPERCONDUCTOR

[75] Inventors: Yasuhisa Aono; Fumio Iida, both of Hitachi; Shinzo Ikeda, Ibaraki-ken; Takahiko Kato, Katsuta; Masakiyo Izumiya, Mito; Hideyo Kodama, Katsuta, all of Japan

[73] Assignee: Hitachi, Ltd., Tokyo, Japan

[21] Appl. No.: 660,392

[22] Filed: Jun. 7, 1996

Related U.S. Application Data

[63] Continuation of Ser. No. 79,916, Jun. 23, 1993, abandoned

[30] Foreign Application Priority Data

Jun. 30, 1992 [JP] Japan ................. 4-172316

[51] Int. Cl.⁶ ........................... B32B 9/00
[52] U.S. Cl. ............... 428/373; 174/125.1; 428/379; 428/930; 505/884; 505/887; 29/599
[58] Field of Search ............... 428/379, 373, 428/930, 374; 174/125.1; 29/599; 505/884, 887

[56] References Cited

U.S. PATENT DOCUMENTS

| | | | |
|---|---|---|---|
| 4,200,767 | 4/1980 | Nomura et al. | 29/599 |
| 4,242,536 | 12/1980 | Young . | |
| 4,285,120 | 8/1981 | Nomura et al. | 29/599 |
| 4,402,768 | 9/1983 | Flukigen | 29/599 |
| 4,863,804 | 9/1989 | Whitlow | 505/887 |
| 4,999,336 | 3/1991 | Nadkarni | 75/252 |

FOREIGN PATENT DOCUMENTS

| | | |
|---|---|---|
| 0 409 269 | 1/1991 | European Pat. Off. . |
| 0 500 101 | 8/1992 | European Pat. Off. . |

OTHER PUBLICATIONS

Geballe, Science vol. 259, Mar. 12, 1993 pp. 1550–1551.
Science News, vol. 135 #9, Mar. 4, 1989, p. 143.

Primary Examiner—Patrick Ryan
Assistant Examiner—Patrick Jewik
Attorney, Agent, or Firm—Antonelli, Terry, Stout & Kraus, LLP

[57] ABSTRACT

A superconducting wire saved in weight and enhanced in mechanical properties is provided without damaging electric and thermal characteristics as an Al stabilizer, and further a method for producing the same, a high strength Al sintered alloy and powders used for the process are provided. A superconducting wire comprising an Al alloy of a high purity Al in which a small amount of ceramic ultrafine particles are dispersed and superconducting filaments embedded in the Al alloy, in which a large number of the ceramic ultrafine particles are dispersed in the area of 1 $\mu m^2$, and the areas of 1 $\mu m^2$ in which a large number of the ceramic ultrafine particles are dispersed, are formed over nearly the whole of the alloy.

12 Claims, 8 Drawing Sheets

SUPERCONDUCTING WIRE AND COMPOSITE SUPERCONDUCTOR

This application is a continuation application of application Ser. No. 079,916, filed Jun. 23 1993 now abandoned.

BACKGROUND OF THE INVENTION

1. Field of the Invention

The present invention relates to superconducting wires and superconducting coils and in particular, to superconducting wires and superconducting coils which are difficult to quench and are high in reliability and which are used for magnetically levitated trains, nuclear magnetic resonance apparatuses and nuclear fusion apparatuses.

2. Description of Related Art

High purity copper has been exclusively used as stabilizers in conventional superconducting wires. Japanese Patent Kokai No.49-10794 discloses an NbTi wire in which an Al material is provided at the center part for weight-saving and which is covered with Cu. Further, a superconducting wire comprising an NbTi multifilamentary wire as the inner part and an Al stabilizer as the outer peripheral part has also been developed. Japanese Patent Kokoku No.59-6005 discloses a superconducting wire having a stabilizing cover layer comprising a high purity Al alloy containing 0.005–5.0% by weight of alumina.

Furthermore, as mentioned in "Journal of the 91th Japan Mechanical Society", No. 835 (June 1988), pages 36–40, NbTi multifilamentary wires of a low Cu content are used for attaining a high current density of coils in superconducting wires for magnetically levitated trains and recently, wires for MLU002 which have the ratio (ratio of sectional areas of Cu/NbTi) of 1.0 are known. Further known are wires having a large sectional area ratio of (Cu+Al)/NbTi and a small sectional area ratio of Al/Cu.

In the course of the development of the above-mentioned conventional techniques, employment of only the pure Cu has been shifted to that of the high Al ratio (high Al/Cu) because as compared with Cu, Al as a stabilizer has the merits, 1) materials of the higher purity can be used, 2) lighter in weight, 3) smaller in electric resistance in magnetic field, 4) higher in cooling efficiency due to the low specific heat, and 5 higher in transmission of elementary particles. However, use of the higher Al ratio has the problems that a space is apt to occur between the wires in coiling due to the softness of Al and the coil is apt to deform due to the electromagnetic force when excited and as a result the mechanical stability is deteriorated. Moreover, the softness of Al deteriorates the composite extrusion processability of Al with a multifilamentary super-conducting wire of the higher strength.

In addition, in the superconducting wire of Japanese Patent Kokoku No.59-6005, alumina particles cannot be uniformly dispersed and sufficient strengthening cannot be attained.

SUMMARY OF THE INVENTION

An object of the present invention is to provide a superconducting wire excellent in mechanical strength and high in reliability by improving only the softness of Al as a stabilizer without losing its light-weight and electrical and thermal characteristics and a method for producing the same and to provide a high strength Al sintered alloy.

Another object of the present invention is to provide a method for producing superconducting wires such as $Nb_3Sn$, $(Nb, Ti)_3Sn$ and NbTi according to which the superconducting filaments can be extruded together with a covering Al stabilizer.

DETAILED DESCRIPTION OF PREFERRED EMBODIMENTS

Figure 1:
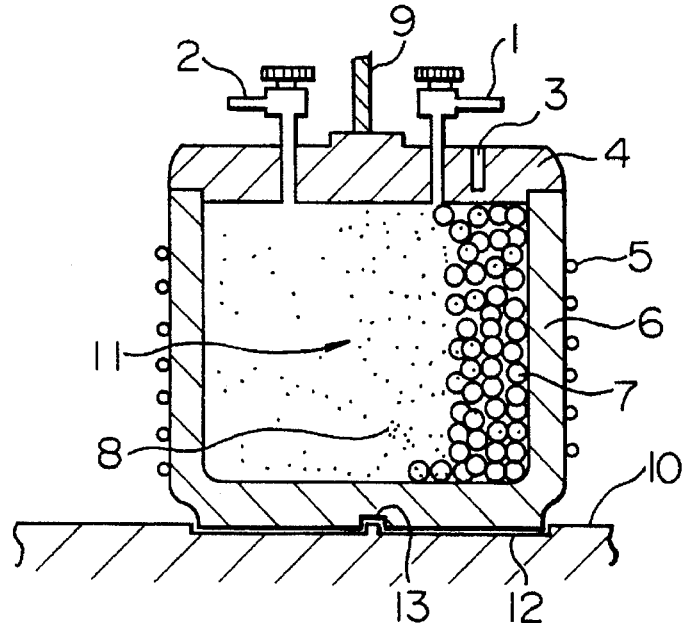
FIG. 1 is a sectional view of the construction of a planetary ball mill which is an apparatus for mechanical alloying according to the present invention.

The present invention resides in a superconducting wire comprising an Al alloy of a high purity Al in which a small amount of ceramic ultrafine particles are dispersed and a superconducting filament embedded in said Al alloy, characterized in that a large number of said ceramic ultrafine particles are dispersed in a region of 1 $\mu m^2$ and the regions of 1 $\mu m^2$ each in which a large number of the ceramic ultrafine particles are dispersed are formed in nearly the whole area of said alloy.

Furthermore, the present invention is characterized in that most of said ceramic ultrafine particles is in the form of particle, 500 or more particles are dispersed in 1 $\mu m^2$ per 1% by weight, and the diameter is 0.02 $\mu m$ or less, and that said ceramic ultrafine particles are dispersed in the region formed by successively connecting, with a drawn straight line, point A (0.01%; 20 nm), point B (0.01%; 500 nm), point C (1.0%; 50 nm) and point D (1.0%; 2 nm) in a logarithmic graph in which the relation between the content of the particles (% by weight) and the average distance (nm) between the particles are expressed by logarithmic scales.

The present invention resides in a multifilamentary superconducting wire comprising an Al alloy of a high purity Al in which a small amount of ceramic ultrafine particles are dispersed and a plurality of superconducting filaments embedded in said Al alloy, characterized in that the number of said superconducting filaments and the average distance (μm) between the filaments are in the region formed by successively connecting, with a drawn straight line, point A (1000; 20 μm), point B (1000; 10 μm), point C (5000; 2 μm) and point D (5000; 0.3 μm) in a logarithmic graph in which the relation between the number of said superconducting filaments and the average distance between the filaments is expressed by logarithmic scales.

It is especially preferred that the average distance between the filaments is present on or below the line which connects point E (1000; 15 μm) and point F (5000; 0.5 μm).

Further, the present invention is characterized in that the diameter (μm) of the superconducting filaments and the average distance (μm) between the filaments are in the region formed by successively connecting, with a drawn straight line, point A (1 μm in diameter; 2 μm in distance), point B (1 μm; 0.3 μm), point C (60 μm; 20 μm) and point D (60 μm; 2.5 μm) in a logarithmic graph in which the relation between the diameter of the superconducting filaments and the average distance between the filaments is expressed by logarithmic scales. It is preferred that the average distance between the filaments is present on or below the line which connects point E (1 μm; 1 μm) and point F (60 μm; 9 μm).

The present invention resides in a superconducting wire comprising an Al alloy of a high purity Al in which a small amount of ceramic ultrafine particles are dispersed and a superconducting filament embedded in the Al alloy, characterized in that said Al alloy has a yield strength of 30 MPa or more at room temperature and an elongation of 40% or more at 100 MPa or less and 15% or more at higher than 100 MPa, especially the yield strength is 30–70 MPa per 0.01% by weight at less than 0.05% by weight in the content of the ceramic ultrafine particles, 10–20 MPa per 0.01% by weight at 0.05–0.1% by weight in the content of the ceramic ultrafine particles, and 40–80 MPa per 0.01% by weight at more than 0.1% by weight and not more than 1% by weight in the content of the ceramic ultrafine particles, and the elongation of said Al alloy at room temperature is 40–120% when the yield strength is 100 MPa or less and 15–40% when it is higher than 100 MPa.

Especially, the present invention is characterized in that the ceramic ultrafine particles are dispersed in the region formed by successively connecting, with a drawn straight line, point A (0.01%; 20 nm), point B (0.01%; 500 nm), point C (1.0%; 50 nm) and point D (1.0%; 2 nm) in a logarithmic graph in which the relation between the content of the particles (% by weight) and the average distance (nm) between the particles are expressed by logarithmic scales.

The method for producing a superconducting wire of the present invention is characterized by including the step of mechanically embedding the ceramic ultrafine particles in the particles of the high purity Al powders to alloy them, the step of sintering the resulting Al alloy powders by hot plastic working, and the step of embedding the superconducting filament in the sintered Al alloy material and forming the alloy material into a wire by hot plastic working.

The present invention resides in a high strength Al sintered alloy comprising a high purity Al in which ceramic ultrafine particles are dispersed, characterized in that a large number of said ceramic ultrafine particles are dispersed in the region of 1 μm$^2$ in nearly the whole area of said alloy and especially mainly in said pure Al crystal grains.

The high strength Al sintered alloy of the present invention is characterized in that it has the yield strength and elongation as mentioned above and especially the yield strength of the Al alloy is 30–70 MPa per 0.01% by weight of the ceramic ultrafine particles when the content of the ceramic ultrafine particles is less than 0.05% by weight, 10–20 MPa per 0.01% by weight of the ceramic ultrafine particles when the content is 0.05–0.1% by weight and 40–80 MPa per 0.01% by weight of the ceramics ultrafine particles when the content is more than 0.1% by weight and not more than 1% by weight and the elongation of said Al alloy at room temperature is 40% or more when the yield strength is 100 MPa or less and 15% or more when it is higher than 100 MPa.

The present invention resides in a powder for an Al sintered alloy, characterized by embedding the ceramic ultrafine particles in the particles of high purity Al powders.

The present invention uses in a superconducting wire or a superconducting coil prepared by winding the superconducting wire in the form of a coil the above-mentioned Al alloy as all of the stabilizers for the wire material and also uses said Al alloy in the multi-filamentary superconducting wire in which filaments such as Nb$_3$Sn, (NbTi)$_3$Sn and NbTi are used as the superconducting filaments.

Furthermore, in a composite conductor comprising a housing and the multifilamentary superconducting wire such as Cu-covered Nb$_3$Sn, (NbTi)$_3$Sn or NbTi or a superconducting coil prepared by winding said conductor in the form of a coil, preferably said housing comprises the above-mentioned highly conductive ceramics dispersion-strengthened Al alloy comprising a high purity Al matrix and one or more of oxide, nitride, carbide and boride particles dispersed in said matrix to increase deformation resistance and the particle size distribution of the dispersed ceramic particles of oxide, nitride, carbide or boride is 0.001–0.02 μm and the content is 0.05–1.0% by weight.

The present invention is a multifilamentary superconducting wire wherein the multifilamentary superconducting wire covering stabilizer is a highly conductive ceramics dispersion-strengthened Al alloy which comprises 0.01–0.1% by weight of at least one of Al$_2$O$_3$, ZrO$_2$, MgO, SiO$_2$, TiO$_2$, AlN, BN, B$_4$C, TiB$_2$, ZrB$_2$, β-SiC, TiC and NbC as ceramic particles of oxide, nitride, carbide and boride and the balance of Al and unavoidable impurities. The particle size distribution of the ceramic particles is preferably 0.001–0.02 μm.

Moreover, in the present invention, the housing material for the conductor of the superconducting wire comprises a highly conductive ceramics dispersion-strengthened Al sintered alloy comprising 0.05–1.0% by weight of ceramic particles and the balance of Al and unavoidable impurities and the particle size distribution of the ceramic particles is preferably 0.001–0.02 μm.

The present invention is a superconducting coil prepared by winding a superconducting wire in the form of a coil in which the covering stabilizer for the multi-filamentary superconducting wire is a highly conductive ceramics dispersion-strengthened Al sintered alloy which comprises 0.01–0.1% by weight of at least one of Al$_2$O$_3$, ZrO$_2$, MgO, SiO$_2$, TiO$_2$, AlN, BN, B$_4$C, SiC, TiC and NbC as particles of oxide, nitride, carbide and boride which are dispersed in the matrix to increase the deformation resistance and the balance of Al and unavoidable impurities and the more strengthened housing material is a highly conductive ceramics dispersion-strengthened Al sintered alloy which comprises 0.05–1.0% by weight of at least one of said oxide, nitride, carbide and boride. and the balance of Al and unavoidable impurities. The particle size distribution of the ceramic particles of the oxide, nitride, carbide or boride dispersed in the stabilizer having Al as a matrix is preferably 0.001–0.02 μm.

In the superconducting coil of the present invention prepared by winding in the form of a coil a superconducting wire comprising a Cu covered multi-filamentary superconducting wire, the stabilizing housing material preferably has a content of the ceramic particles of 0.01–0.1% by weight.

Furthermore, the present invention is a method for producing superconducting stabilizer powders having Al matrix which comprises mechanically alloying mixed powders comprising high purity Al powders and at least one of $Al_2O_3$, $ZrO_2$, MgO, $SiO_2$, $TiO_2$, AlN, $TiB_2$, $ZrB_2$, BN, $B_4$ C, β-SiC, TiC and NbC high purity ceramic powders by a high energy ceramics ball mill to disperse at least one of said ceramic particles having a particle size distribution of 0.001–0.02 μm in the alloy. The mechanical alloying by ball mill can be most suitably carried out by keeping the ceramic container containing the mixed powders and ceramic balls at a temperature in the range of 100°–200° C. and simultaneously subjecting the container to degassing treatment to the inner pressure of $10^{-2}$–$10^{-3}$ torr, then replacing the inner atmosphere with Ar gas or He gas of high purity of 99.9% or higher under 1 atm., and thereafter carrying out alloying treatment at a revolution speed of 200–400 rpm for 10 hours or more, preferably 10–20 hours at about room temperature.

Further, in the present invention the purity of the mechanically alloying Al powders is preferably 99.99% by weight or higher and the average particle size of the superconducting stabilizer powders is preferably 500 μm or less, more preferably 20–200 μm.

In the present invention, the average particle size of the ceramic particles before mechanically alloyed is preferably 0.1 μm or less and the purity is preferably 99.0% by weight or higher.

Furthermore, the present invention is a method for producing a superconducting stabilized and strengthened material provided with high electric conductivity which comprises the step of mechanically alloying mixed powders comprising high purity Al powders and at least one of $Al_2O_3$, $ZrO_2$, MgO, $SiO_2$, $TiO_2$, AlN, $TiB_2$, $ZrO_2$, BN, $B_4C$, β-SiC, TiC and NbC high purity ceramic powders, the step of packing the mechanically alloyed powders in a metallic container, the step of degassing the container and then sealing the container, the step of compacting the sealed container by hot hydrostatic extrusion or hot extrusion and the step of subjecting the compacted container to a final heat treatment.

As the superconducting filament materials, there are alloys and intermetallic compounds and the Al alloys of the present invention can be applied to both of them.

As the alloys, there may be used 30–65 wt % Ti-Nb alloys (Ti 46.5 wt %, 30 wt %, 40 wt %), these alloys which additionally contain 10–25% by weight of one of Zr, Ta and Hf and furthermore, Nb-Zr, Nb-Hf, V-Ti (Cr, Ta) and Mo-Re alloys.

As the intermetallic compounds, there may be used additionally $Nb_3Al$, $V_3Ga$, $Nb_3Ga$ and $Nb_3Ge$.

Al has the superior characteristics as compared with Cu at cryogenic temperatures at which operation is carried out by superconducting coils. Al of 99.999% in purity shows a residual resistance ratio of about 1000 which is expressed by the ratio of the electric resistance at room temperature to the electric resistance at 4.2° K and this Al is 0.91 time in heat capacity, 6.4 times in thermal conductivity and 0.14 time in electric resistance ratio in a magnetic field of 5 T as compared with oxygen free copper which is generally used as a stabilizer. From this point, too, the Al is far higher than the Cu stabilizers in the margin of safety of superconducting coils when the conditions such as shape, size and working point are the same.

However, the softness of Al, namely, the low strength causes deterioration in integral extrusion processability especially in production of composite multifilamentary superconducting wires. This is due to the low work-hardening rate although it is also due to the higher purity of Al. In order to perform the strengthening without losing the above-mentioned characteristics of Al, one approach is to alloy with other elements, but this causes deterioration of electric and thermal characteristics. For improving only the strength with maintaining the characteristics of high purity Al matrix, there is a method of dispersing ceramic fine particles such as oxides, nitrides, carbides or borides which are less reactive with the matrix and thus inhibiting the transposition movement which produces the plastic deformation. The dispersion can be carried out by simultaneous dissolution of Al and the ceramic powders. In this case, the ceramics react with the molten Al to decompose and disappear or partially decompose and partially remain and the decomposed elements contaminate the Al matrix and this Al cannot serve as stabilizers. Accordingly, the mechanical alloying method which can form an alloy at about room temperature is suitable.

The ceramic powders used here comprise one or more of oxides, nitrides, carbides and borides and especially preferred are one or more of $Al_2O_3$, $ZrO_2$, MgO, $SiO_2$, $TiO_2$, AlN, $TiB_2$, $ZrB_2$, BN, $B_4$ C, β-SiC, TiC and NbC which are low in reactivity with Al. It is preferred to carry out the mechanical alloying so that the particle size distribution of the ceramic powders in the dispersion-strengthened alloy is 0.001–0.02 μm. It is preferred to use the ceramic powders having an average particle size of 0.1 μm or less before alloying. This is because the ceramic particles are ground to fine particles in the ball mill, but the fine particle distribution depends on the starting particle size. The necessity for the desired particle size distribution being in the range of 0.001–0.02 μm is given by the facts that the lower limit for the particle size of the fine particles formed by the mechanical alloying is in the order of 0.001 μm, the effective resisting power against the transposition is considered to be about 0.02 μm at maximum and furthermore, the lower limit of the thickness of the multifilamentary wire coating stabilizer is about 0.5 μm. Especially preferred is 0.01 μm or less. High purity ceramics containing no other metals are preferred for obtaining the low reactivity between the ceramic particles and the Al matrix material material and for maintaining the high purity of the Al matrix and a purity of at least 99.0% is suitable especially from the point of industrial productivity. Especially, AlN is high in non-reactivity with Al and is preferred.

The addition amount of the ceramic powders varies depending on whether the stabilizer is used as multifilamentary wire coating stabilizer or used as the stabilizer contained in the central portion of the multifilamentary wire or provided around the wire as a housing. The multifilamentary wire coating stabilizer which is subjected to a wire drawing step must have a proper deformation resistance against the composite multifilamentary extrusion, but when it has a high strength, there occurs reduction in ductility to cause peeling and breaking. Therefore, a yield strength of 30–100 MPa and an elogation of 40–120% at room temperature are preferred and a small addition amount of 0.01–0.1% by weight is preferred and 0.02–0.05% by weight is more preferred. On the other hand, the stabilizers as contained in the wire or provided as a housing are preferably highly strengthened and a yield strength of 150–400 MPa and an elogation of 15–40% at room temperature are preferred. The addition amount is preferably 0.05–1% by weight, more preferably 0.1–0.5% by weight.

There is no need to use fine particles in the order of μm in average particle size as the pure Al powders because Al is soft and is sufficiently deformed at the time of the mechanical alloying and an average particle size of 500 μm or less is suitable. Further, the purity is preferably 99.99% by weight or higher for obtaining high purity stabilizer matrix.

The atmosphere for carrying out the mechanical alloying is preferably drawn to a vacuum of $10^{-2}$–$10^{-3}$ torr at 100°–200° C. for 30–60 minutes before alloying and thereafter replaced with Ar or He gas of high purity of 99.9% or higher. In order to attain an optimum alloying, a revolution speed of the ball mill of 200–400 rpm and an operation time of 10–20 hours are most suitable. Incorporation of metallic components from the balls and the container in the alloying deteriorates the electric and thermal characteristics of the stabilizer. Therefore, balls and container made of ceramics are preferred. The amount of the metals which incorporate is desirably less than 0.1% by weight. Incorporation of the metallic components can be avoided by using the balls and container made of ceramics.

Solidification of the dispersed alloy powders by sintering can be carried out by packing the alloy powders in an Al container and subjecting the container to hot extrusion, HIP or hot pressing method. The sintering is preferably carried out at 550°–630° C. considering the diffusion coalescence and densification of the alloy powders. The vacuumizing treatment of the container carried out as a pretreatment is the same as mentioned above, but in order to avoid the contamination with impurities such as oxygen at the time of sintering at high temperatures, the treatment is preferably carried out at $10^{-5}$–$10^{-6}$ torr and stepwise at 100° C. for 10–30 minutes, at 200° C. for 10–30 minutes and at 400° C. for 30 minutes.

In the present invention, superconducting wires stable in strength, electric and thermal characteristics can be obtained by using the above-mentioned ceramics dispersion-strengthened Al alloy as the multifilamentary wire covering stabilizer. Furthermore, by using the ceramics dispersion-strengthened Al alloy as the internal central portion of the multifilamentary wire or as the housing provided at the outer periphery of the wire, superconducting coils comprising only the Al matrix as the stabilizer can be produced. Furthermore, when a Cu-covered multifilamentary wire is used, also the performance of superconducting coils can be improved by using said ceramics dipersion-strengthened Al alloy as the internal material or the housing material.

In the present invention, 5 or more ceramic ultrafine particles are dispersed per 1 μm² in nearly the whole area of the alloy and the number of the ceramic particles dispersed abruptly increases depending on the content and is preferably 500 or more, more preferably 1000 or more per 0.01%. The average distance between the ceramic particles varies depending on the content and the average distance is preferably on or below the straight line which connects point E (0.01%; 100 nm) and point F (1.0%; 10 nm) and the straight line which connects point G (0.01%; 50 nm) and point H (1.0%; 5 nm) in the logarithmic scale. Such can be obtained by the method for producing Al alloys of the present invention.

Furthermore, the residual resistance ratio in the present invention is preferably 100–650.

Decrease in the tensile strength of the Al sintered alloy of the present invention at 300° C. than the tensile strength at room temperature is 20 MPa or less, preferably 10 MPa or less and more preferably 5 MPa or less. As in the present invention, by the uniform dispersion of the ultrafine particles, high strength can be obtained with very low content of the particles and furthermore, since the content is very low, a high elongation can be obtained. By using such Al alloy of the present invention, there can be obtained superconducting wires having the above-mentioned relation between the number of the filaments or the diameter of the filaments and the average distance between the filaments.

The present invention will be illustrated below with respect to some examples and drawings.

EXAMPLE 1

FIG. 1 is a structural view of the planetary ball mill used for producing the dispersion-strengthened Al alloy of the stabilizer for the superconducting wires and superconducting coils according to the present invention. The ball mill comprised a $ZrO_2$ lid 4 provided with a vacuum drawing valve 1, an Ar gas replacing valve 2 and a small hole 3 for measurement of temperature, a 2-liter $ZrO_2$ container 6 equipped with a tape heater 5, $ZrO_2$ balls 7 of 10 mm in diameter contained in the container 6, mixed powders 8 and press bar 9. A rotation is transmitted to a rotating table 10 from an external driving system and a centrifugal force of the four containers 6 arranged crosswise is generated in the direction of arrow 11 and simultaneously, rotation of each container per se also occurs and thus the balls in the containers 6 rotate along the inner wall of the containers 6 to bring about collision between balls 7 and between the balls and the inner wall of the container 6. The purity of the starting particles, kinds of main impurities in the starting particles and the average particle size of the starting particles used in the present invention are shown in Table 1. The content of the ceramic particles is (1) 0.02%, (2) 0.04%, (3) 0.1% and (4) 0.5% by weight.

Table 1

| Powders used | Purity (wt %) | Average particle size (μm) |
| --- | --- | --- |
| Al | 99.999 | 120 |
| $Al_2O_3$ | 99.999 | 0.05 |
| $ZrO_2$ | 99.9 | 0.1 |
| MgO | 99.99 | 0.06 |
| $SiO_2$ | 99.99 | 0.1 |
| $TiO_2$ | 99.9 | 0.07 |
| AlN | 99.9 | 0.05 |
| BN | 99.4 | 0.07 |
| $B_4C$ | 99.0 | 0.1 |
| β-SiC | 99.5 | 0.08 |
| TiC | 99.5 | 0.05 |
| NbC | 99.0 | 0.06 |

1500 g of mixed powders of Al powders and one of $Al_2O_3$, $ZrO_2$, MgO, $SiO_2$, $TiO_2$, AlN, BN, $B_4C$, β-SiC, TiC and NbC powders shown in Table 1 were packed in the four ball mill containers together with 200 balls in a glow box of a high purity Ar atmosphere. The balls and the inside of the ball mill container were sufficiently washed by previous operation of the ball mill in alcohol and acetone. For the mechanical alloying treatment, the atmosphere in the container was replaced with Ar gas of high purity of 99.99% and of 1 atm when the degree of vacuum reached $10^{-2}$–$10^{-3}$ torr by drawing to vacuum and subsequent heating at about 120° C. and the container was sealed. The rotational speed was 250 rpm and the treating time was 24 hours. After the mechanical alloying, the alloyed powders were transferred to a storage container in said glow box and the container was vacuum sealed. It was seen that the ceramic particles were embedded in the Al powders while the alloyed powders were ground with being flattened and a large number of deformation and forging were repeatedly carried out. Similar treatment was conducted on the alloyed powders obtained by similar mechanical alloying by the ball mill using high purity Al powders of 250 meshes on the surface of which alumina was formed. By such alloying, the alumina on the surface was alloyed very finely into the Al powders and simultaneously uniformly dispersed.

Next, explanation will be made on solidification sintering treatment of the above-mentioned dispersion-strengthened Al alloy powders. The alloyed powders were packed in an Al container of 99.99% in purity provided with a vacuum drawing pipe in a glow box and drawing to a vacuum of $10^{-2}$–$10^{-3}$ torr was carried out under the conditions of 20 minutes at 100° C., 20 minutes at 200° C. and 30 minutes at 400° C. After completion of the drawing to vacuum, the pipe was pressure welded At two portions and the end of the pipe was TIG welded. The sintering was carried out at 600° C. for 1 hour by hot isostatic press (HIP) apparatus and thereafter, hot working was carried out at 550° C. From the final alloy, samples for evaluation of the electric resistance and the tensile deformation were prepared and annealed at 600° C. for 1 hour in a vacuum of 2–4×$10^{-6}$ torr. The electric characteristics were evaluated in terms of the residual resistance ratio expressed by (electric resistance at room temperature/electric resistance at 4.2 K). The tensile deformation characteristics were evaluated in terms of the yield strength and elongation at room temperature. The results on various dispersion-strengthened Al alloys are shown in Table 2.

TABLE 2

| No. | Sample alloy | Residual resistance ratio | Yield strength (MPa) | Elongation (%) |
|---|---|---|---|---|
| 1 | Al | 740 | 8 | 125 |
| 2 | Al$_2$O$_3$-1 | 330 | 50 | 64 |
| 3 | Al$_2$O$_3$-4 | 240 | 247 | 22 |
| 4 | ZrO$_2$-1 | 570 | 43 | 57 |
| 5 | ZrO$_2$-2 | 420 | 81 | 44 |
| 6 | ZrO$_2$-3 | 280 | 120 | 28 |
| 7 | ZrO$_2$-4 | 210 | 370 | 19 |
| 8 | MgO-1 | 340 | 38 | 68 |
| 9 | MgO-4 | 180 | 210 | 30 |
| 10 | SiO$_2$-1 | 410 | 48 | 72 |
| 11 | SiO$_2$-1 | 205 | 254 | 28 |
| 12 | TiO$_2$-1 | 540 | 41 | 95 |
| 13 | TiO$_2$-4 | 260 | 288 | 31 |
| 14 | AlN-1 | 640 | 49 | 110 |
| 15 | AlN-2 | 420 | 67 | 75 |
| 16 | AlN-3 | 310 | 180 | 41 |
| 17 | AlN-4 | 240 | 319 | 36 |
| 18 | BN-1 | 620 | 50 | 98 |
| 19 | BN-2 | 500 | 73 | 72 |
| 20 | BN-3 | 370 | 170 | 38 |
| 21 | BN-4 | 280 | 342 | 20 |
| 22 | β-SiC-1 | 480 | 32 | 88 |
| 23 | β-SiC-4 | 250 | 211 | 24 |
| 24 | TiC-1 | 520 | 69 | 71 |
| 25 | TiC-4 | 280 | 290 | 19 |
| 26 | NbC-1 | 550 | 61 | 75 |
| 27 | NbC-4 | 280 | 330 | 18 |

Added amount:
1: 0.02%; 2: 0.04%;
3: 0.1%; 4: 0.5%

In the above table, numerals 1 to 4 added after the name of the ceramics mean the amount of them as shown just below the table. With increase in the amount of the ceramics, the residual resistance ratio generally decreased, but in the case of 0.5%, the ratio decreased to less than 200 in one of the alloys while the decrement was sufficiently small in other alloys and they satisfied the value 200 or more required as stabilizers. Increase in the yield strength due to the dispersion-strengthening was recognized in all of the samples and with increase in the amount of the ceramics the strength increased and on the contrary the elongation decreased, but the elongation was still sufficient. A dispersion amount of the ceramics of nearly 0.01% corresponds to the yield strength of pure Cu. As the filament covering stabilizer, since the alloy is subjected to the severer extrusion, the suitable concentration of the ceramics is considered to be about 0.01–0.05% taking into consideration the elongation. As the housing, 0.05–0.1% is considered to be suitable.

In this example, the ceramic particles were mostly dispersed in Al crystal grains and were mostly in the particle form.

Figure 2:
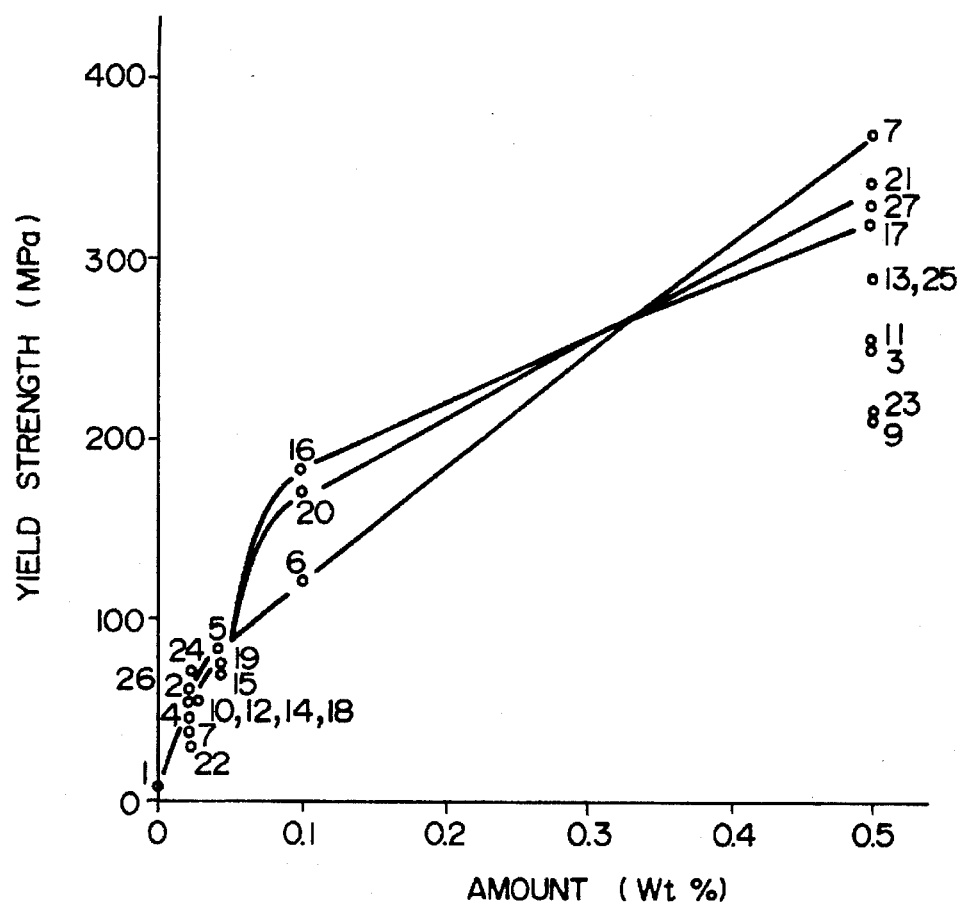
FIG. 2 is a graph showing the relation between the yield strength of the ceramics dispersed Al alloy and the amount of the ceramics.

FIG. 2 is a graph which shows the relation between the amount of the ceramics and the yield strength. As shown therein, with increase in the amount of the ceramics, the yield strength abruptly increases. The rate of the increase is in the following ranges.

The content of ceramics: 0.01–0.1%
  Lower limit: Yield strength (MPa)≧content of ceramics (% by weight)×1000
  Upper limit: Yield strength (MPa)≦content of ceramics (% by weight)×1400+60

The content of ceramics: more than 0.1% and not more than 1.0%
  Lower limit: Yield strength (MPa)≧content of ceramics (% by weight)×350+40
  Upper limit: Yield strength (MPa)≦content of ceramics (% by weight)×500+150

Figure 3:
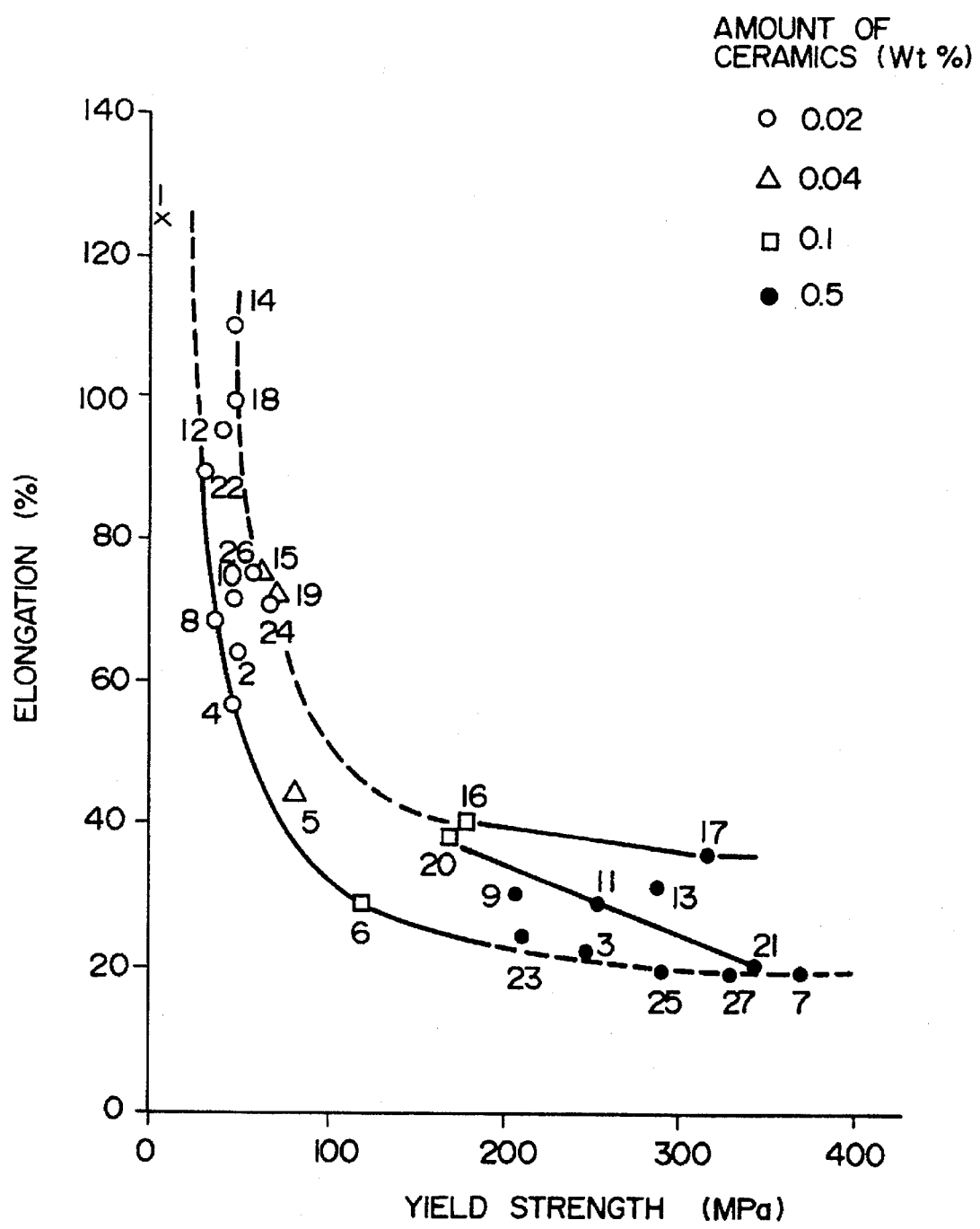
FIG. 3 is a graph showing the relation between the yield strength and the elongation of the ceramics dispersed Al alloy.

FIG. 3 is a graph which shows the relation between the yield strength and the elongation. As shown therein, with increase in the yield strength, the elongation decreases, but a high elongation of 18% or more can be obtained for the Al sintered alloy of the present invention. The yield strength and elongation of the Al sintered alloy of the present invention vary depending on the content of the ceramics and the strength and the elongation vary in the following ranges.

The content of ceramics: Less than 0.05% by weight
  Yield strength (MPa)=Content of ceramics (% by weight) ×(3000–7000)

The content of ceramics: 0.05–0.1% by weight
  Yield strength (MPa)=Content of ceramics (% by weight) ×(1000–2000)

The content of ceramics: More than 0.1% by weight and not more than 1.0% by weight Yield strength (MPa)=Content of ceramics (% by weight) ×(400–800)

With reference to the elongation, at least 30%, especially 40–120% at a yield strength of 100 MPa or less and at least 15%, especially 15–50% at a yield strength of more than 100 MPa are obtained.

Figure 4:
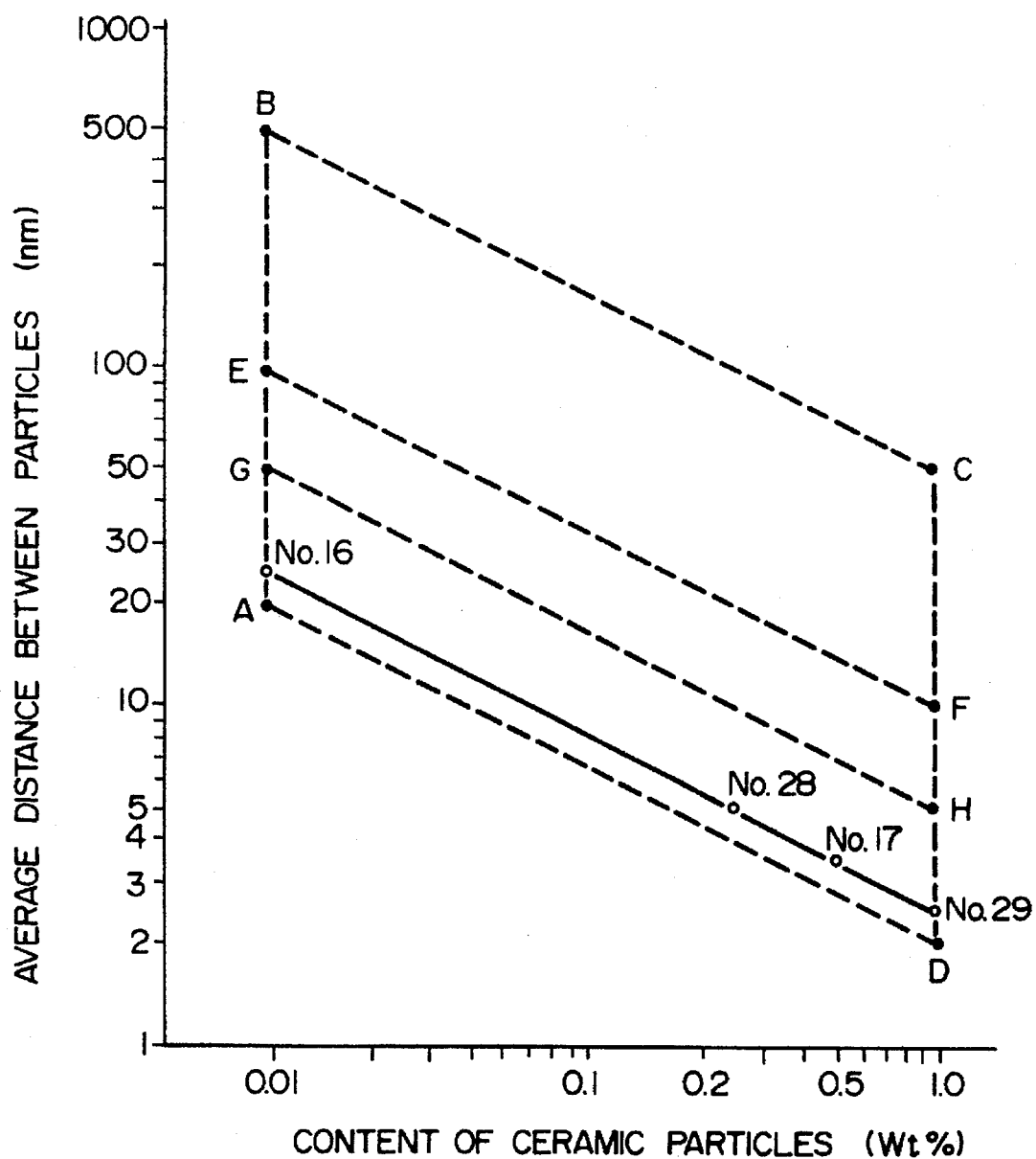
FIG. 4 is a graph which shows the relation between the average distance between the ceramic particles dispersed and the amount of the ceramic particles.

FIG. 4 is a graph which shows by logarithmic scale the relation between the amount of the ceramic particles dispersed and the average distance between the ceramic particles dispersed. The diameter of the ceramic particles dispersed in pure Al in this example war 0.01 µm or less and especially, about 95% or more of them in the number were mostly in the range of 0.002–0.008 µm (0.005 µm in average). In this example the strengthening and the excellent elongation and electric characteristics can be obtained by fine and uniform dispersion of the ceramic ultrafine particles in the Al crystal grains and Nos. 28 and 29 in which the average distance between the dispersed particles was obtained on the degree of dispersion contained 0.25% by weight and 1.0% by weight of AlN, respectively. As shown in FIG. 4, the average distance between the particles decreased with increase in the content of the ceramics, whereby Al is strengthened. In this example, the average distance between the ceramic ultrafine particles was about 2.5 nm when the content of the particles was 1.0% by weight, about 3.5 nm when 0.5%, about 5 nm when 0.25% and about 25 nm when 0.01%. Furthermore, it was recognized that the number of AlN particles dispersed in the region of 1 µm$^2$ was about 1500 when the content of the particles was 0.01% and the number when the content was 0.1% and 1.0% increased nearly in proportion to the content. The ceramic particles in this example are as explained above, but may be larger and it is preferred that the ceramic particles are dispersed so that the average distance between the particles is within the region formed by successively connecting, with a drawn straight line, point A (0.01%, 20 nm), point B (0.01%, 500 nm), point C (1.0%, 50 nm) and point D (1.0%, 2 nm) and on or below a drawn straight line which connects point E (0.01%, 100 nm) and point F (1.0%, 10 nm) and a drawn straight line which connects point G (0.01%, 50 nm) and point H (1.0%, 5 nm). The strength can be higher by dispersing the ceramic particles so that the distance between the particles is smaller. The electric characteristics, strength and elongation are sufficient when the distance is above the straight line which connects point A and point D.

The sample No. 28 in this example was subjected to the tensile test at 300° C. The resulting value showed the decrement of only about 5 MPa or less, than the tensile strength at room temperature.

EXAMPLE 2

Figure 5:
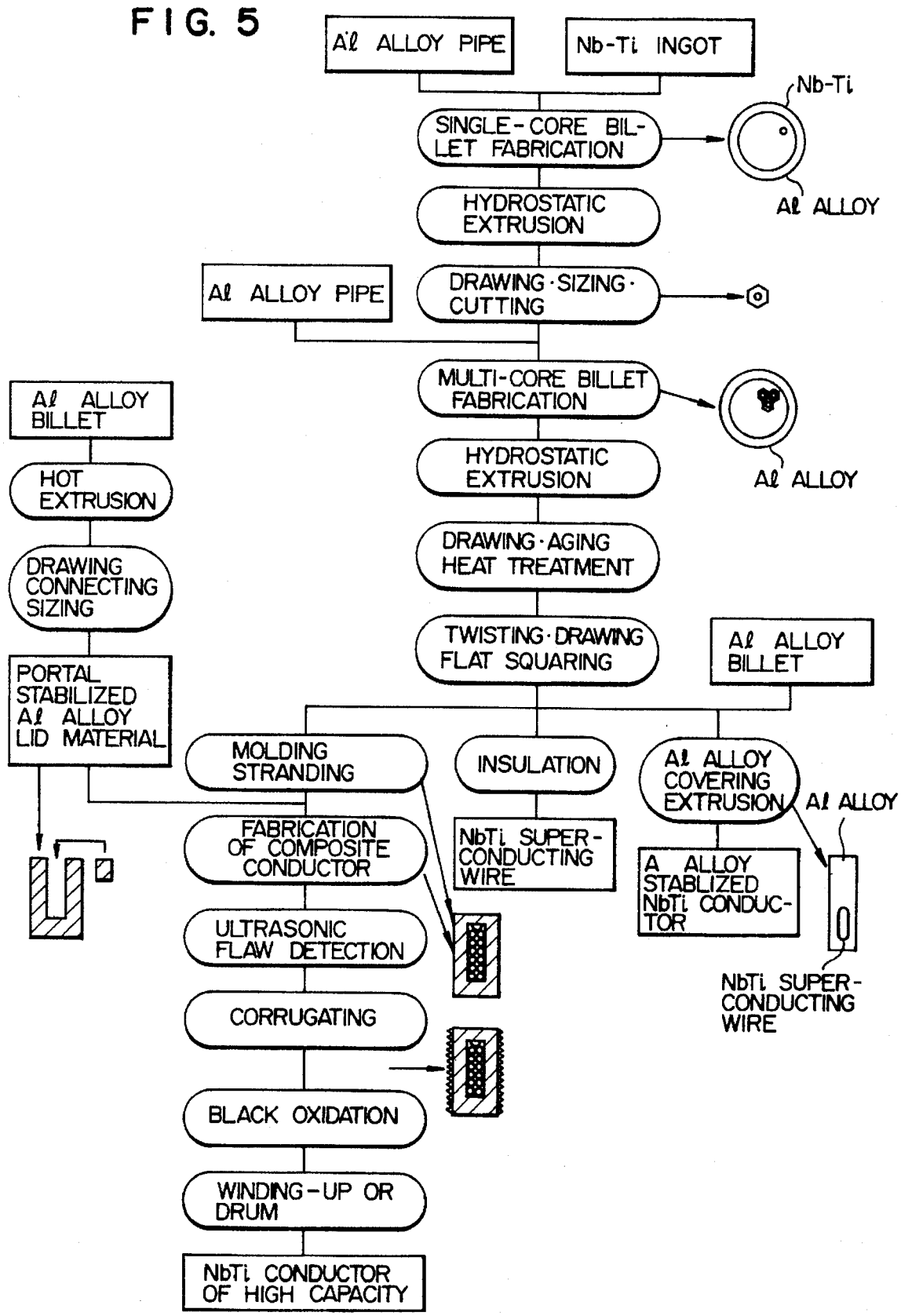
FIG. 5 is a flow sheet showing the steps for the production of superconducting wire of Nb-Ti alloy filaments according to the present invention.
Figure 6A:
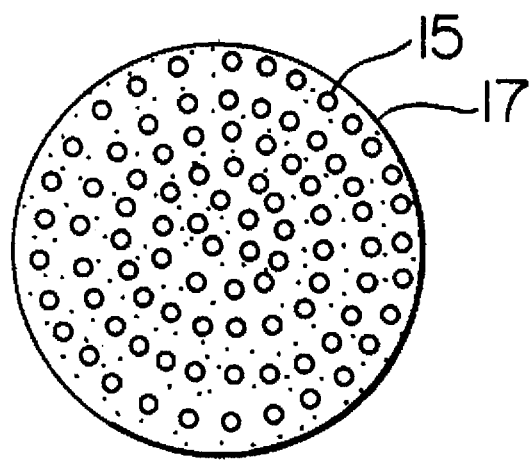
FIGS. 6A and 6B are sectional views of the superconducting wire of the present invention.
Figure 6B:
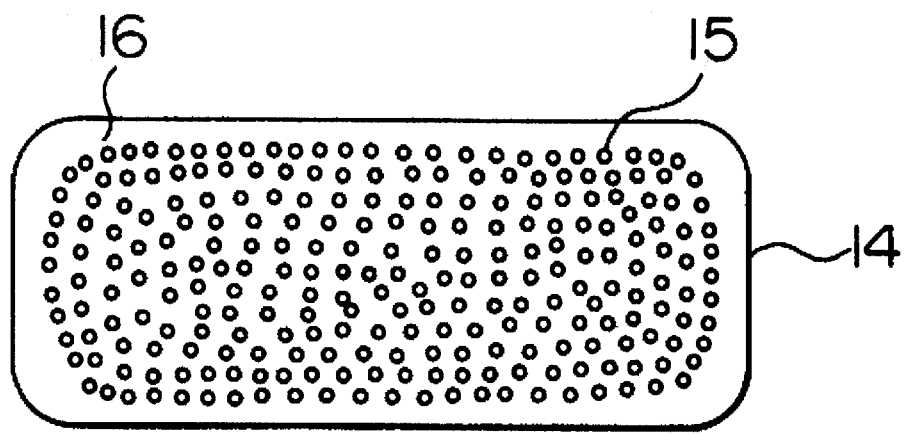

FIG. 5 is a flow sheet which shows the production steps of one multifilamentary superconducting wire of the present invention. The superconducting wire material 14 had a plan section of 1.5 mm×3.5 mm and there was obtained a flat square multifilamentary superconducting wire as shown in FIGS. 6A and 6B which comprised a 0.08 wt % AlN dispersion-strengthened Al alloy matrix 16 produced in Example 1 and 1500 filaments 15 having a diameter of 47 µm of Nb-46.5 wt % Ti which were uniformly embedded in said matrix 16. FIG. 6A is a magnification of FIG. 6B and many ultrafine particles of AlN were uniformly dispersed between the filaments 15.

This wire was prepared by gathering 1500 NbTi single-filamentary composite wires covered with AlN dispersion-strengthened Al alloy by hydrostatic extrusion and inserting them in a pipe of the Same AlN dispersion-strengthened Al alloy as the covering material, then subjecting the pipe to hydrostatic extrusion and wire drawing and thereafter subjecting the wire to a heat treatment at 375° C. for 100 hours. The average distance between the closest surfaces of the filaments was about 10 µm.

This wire was compared with a wire of the same size prepared using a stabilizer comprising only Cu to find that the former was 78% in weight per unit length, about 200% in heat capacity at 4.2 K, 5 T, and 270% in heat conduction in the transverse direction of the wire at 4.2 K. Considering the state that when a superconducting coil is excited with a constant current of less than the critical current of the wire, a heat is generated due to some turbulence and quenching is carried out, the minimum heat energy necessary for the quenching is in proportion to the heat capacity and the heat conduction of the wire and is in inverse proportion to the electric resistance of the matrix if the relation between the critical current of the wire and the working point is the same. Accordingly, it became clear that the superconducting wire of the present invention had a margin in stability which was about 20 times that of the conventional wire.

EXAMPLE 3

A round multifilamentary superconducting wire prepared by embedding 1060 filaments having a diameter of 50 µm and comprising an Nb-46.5 wt % Ti alloy through the same production steps as in Example 2 was subjected to composite processing with a portal stabilizing high purity Al alloy (No.17) as shown in the flow sheet of FIG. 5 and the surface was subjected to corrugating process and then blackening process to produce an NbTi composite conductor of high capacity. The superconducting wire had a diameter of 2.3 mm and the average distance between the closest surfaces of the filaments was about 16.5 µm.

EXAMPLE 4

A flat square multifilamentary superconducting wire having 1700 filaments which was obtained through the same steps as in Example 2 was embedded in a high purity Al billet as shown in the flow sheet of FIG. 5 and the wire was extruded to obtain an Al stabilized NbTi superconductor.

EXAMPLE 5

Through the same steps as in Example 2, there was obtained a strand of 0.7 mm diameter in which the diameter of the filaments was 8 µm and the number of the filaments was 3700 and which had at the center portion a core wire of the stabilizing Al alloy of about 200 µm in diameter. The average distance between the closest surfaces of the filaments was about 1.5 µm. Twentyseven of the wires were formed with Al covering to obtain a Rutherford type conductor as a conductor for a wedge type magnet.

EXAMPLE 6

Figure 7:
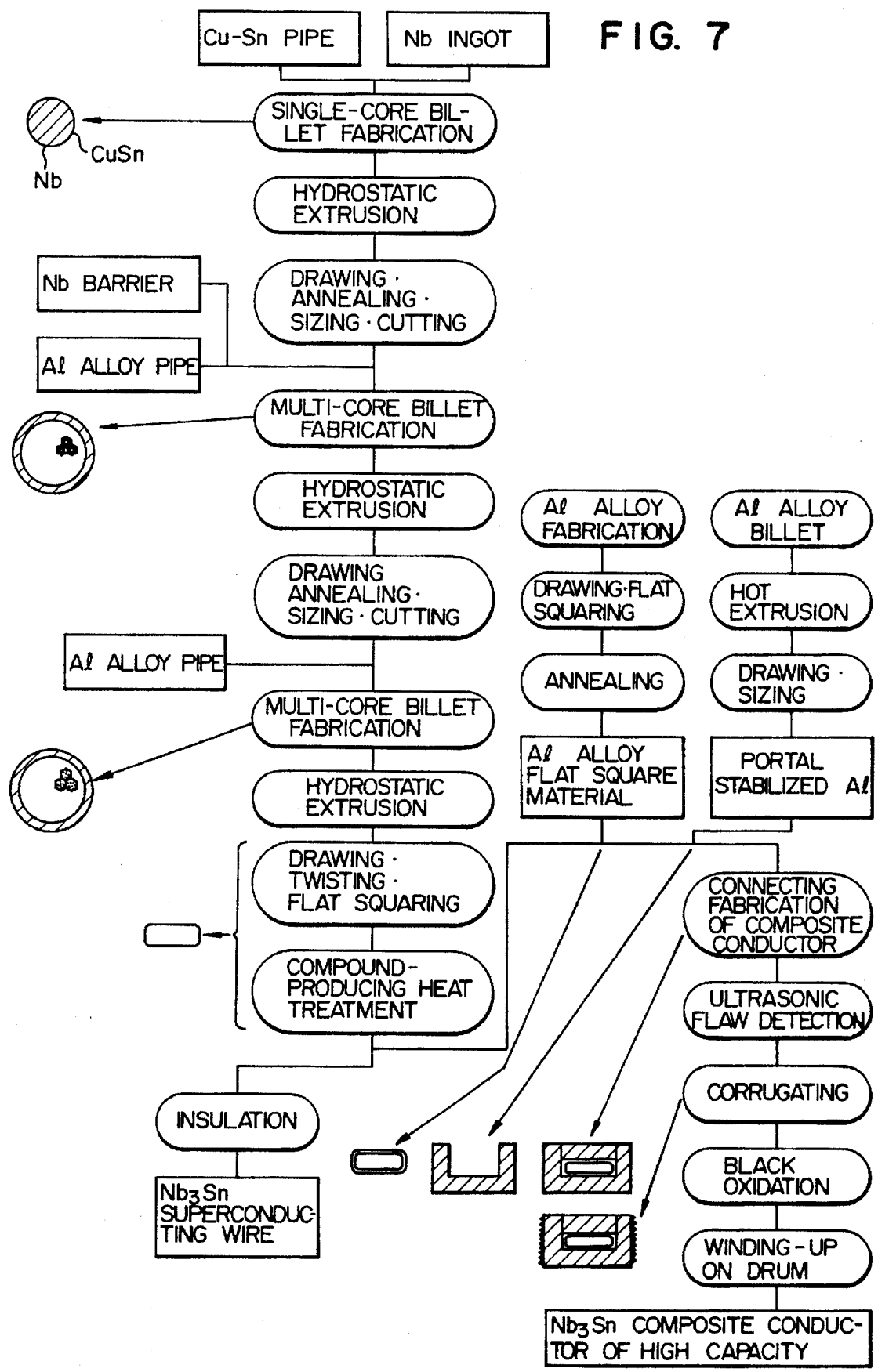
FIG. 7 is a graph showing the relation between the number of filaments and the average distance between the filaments.

An Nb$_3$Sn filament superconducting strand was prepared by the steps shown in FIG. 7. The diameter of the strand was 2.5 mm and the diameter of the filament was 4 µm and a multifilamentary superconducting wire containing about 80,000 filaments was produced. In FIG. 7, bronze containing 12.5% by weight of Sn was used for the Cu-Sn pipe. Many of this monofilamentary wire were bundled and covered with a pipe of AlN dispersed Al alloy containing 0.04% by weight of AlN of No.15 obtained in Example 1. This was extruded to make a strand. Many of these strands were bundled and similarly covered with the Al alloy pipe and extruded to reduce the diameter. Then, this was heat treated. This was similarly covered with an Al alloy containing 0.15% by weight of AlN and was embedded in a portal stabilizing Al alloy having the same compositions as of the above Al alloy to obtain an $Nb_3Sn$ composite conductor of high capacity. The average distance between the closest surfaces of the filaments was about 2.5 μm. This superconducting wire is suitable for a high magnetic field magnet of about 10 tesla or more.

Figure 8:
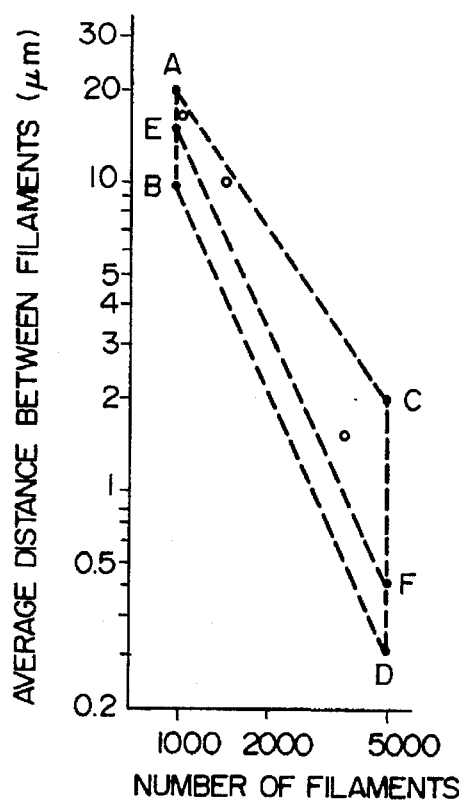
FIG. 8 is a flow sheet showing the steps for production of superconducting wire of $Nb_3Sn$ filaments according to the present invention.

FIG. 8 is a graph which shows in logarithmic scales the relation between the number of the filaments in the superconducting wire strand and the average distance between the filaments shown by the average of the shortest distances between the filaments. The points shown in the graph are values in the respective examples. The average distance between the filaments decreases with increase in the number of the filaments and the relation between the number and the distance in the present invention can be within the region formed by connecting the points A–D and furthermore, the distance can be smaller, namely, on or below the line which connects the points E and F. The reason why such distance can be employed is that very fine particles are used not so as to give adverse effect on the filaments. By dispersing between the filaments ceramic particles far smaller than the distance, many ceramic particles are dispersed between the filaments.

Figure 9:
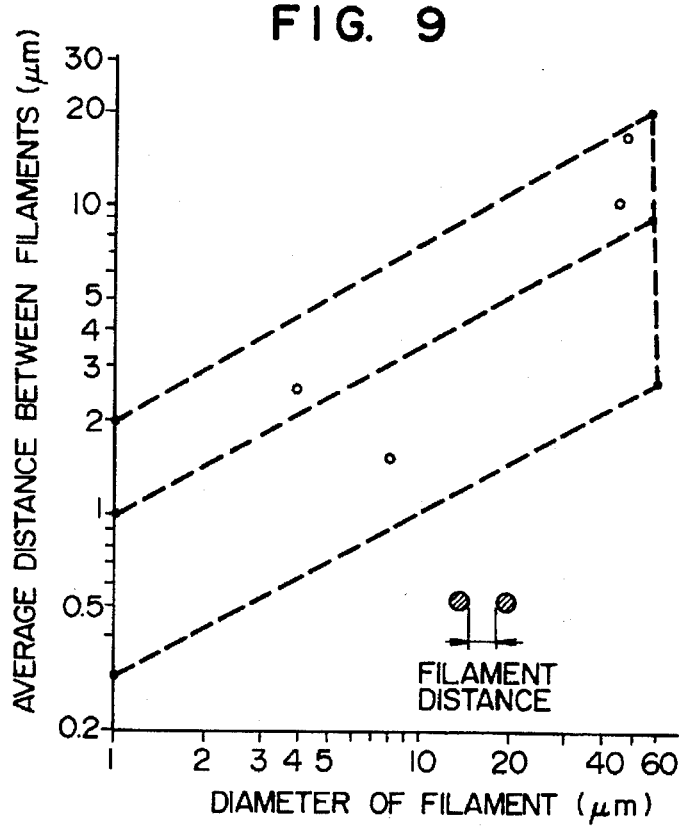
FIG. 9 is a graph showing the relation between the diameter of filaments and the average distance between the filaments.

FIG. 9 is a graph which similarly shows in logarithmic scales the relation between the diameter of the filaments (μm) and the average distance between the filaments (μm). As shown, the distance between the filaments can be made smaller by reducing the diameter of the filaments. Especially, the relation is preferably in the region formed by connecting the points A–D. More preferably, the average distance is on or below the line which connects the points E and F. For the same reason as above, the distance can be made smaller.

The Al alloys used in the above examples can be similarly used for the various superconducting wires shown in FIGS. 10–14.

Figure 10:
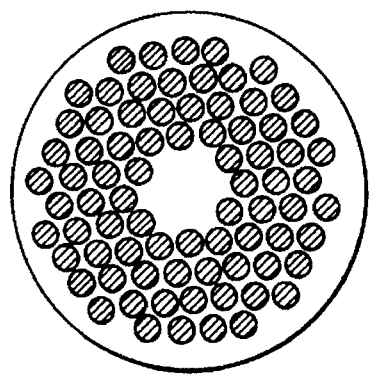
FIG. 10 is a sectional view of the superconducting wire of the present invention.
Figure 11:
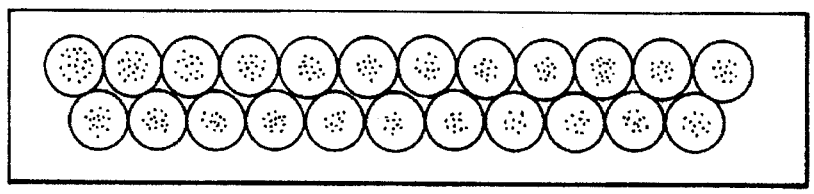
FIG. 11 is a sectional view of the superconducting wire of the present invention.
Figure 12:
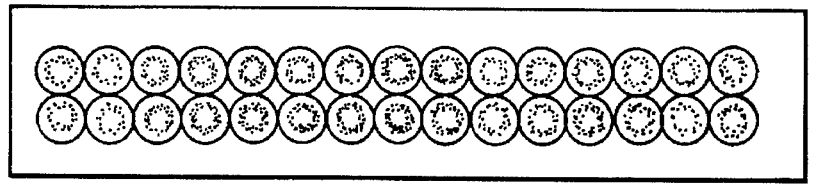
FIG. 12 is a sectional view of the superconducting wire of the present invention.

FIGS. 10–12 show sintered stranded cable conductors as wire materials for pulsed magnet which uses Nb-Ti alloy wires. FIG. 10 shows a multifilamentary strand, FIG. 11 shows an inner conductor strand, and FIG. 12 shows an outer conductor strand. Al alloy is used as both the covering and the housing.

Figure 13:
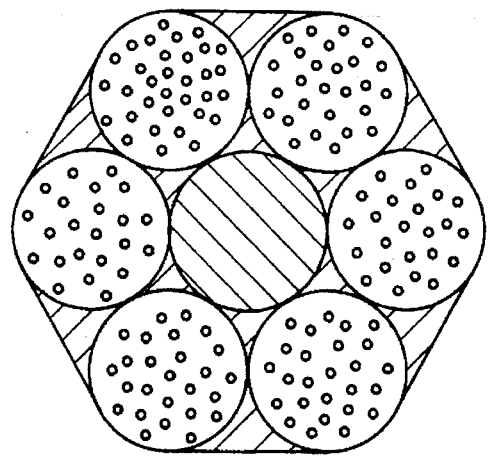
FIG. 13 is a sectional view of the superconducting wire of the present invention.
Figure 14:
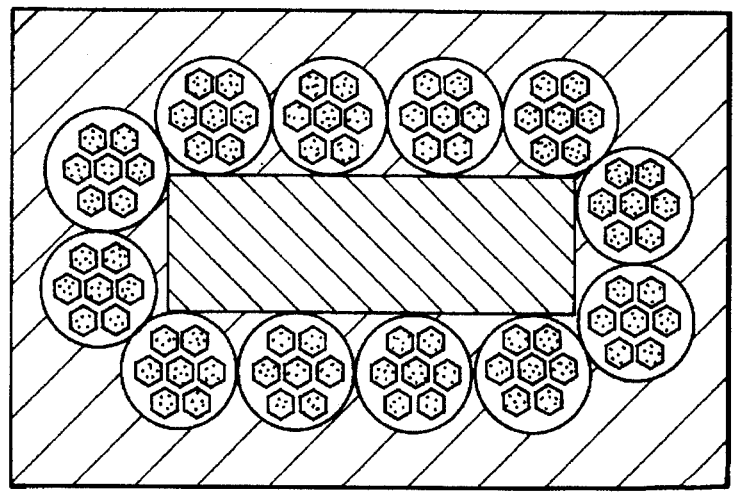
FIG. 14 is a sectional view of the superconducting wire of the present invention.

FIG. 13 shows a multifilamentary $V_3Ga$ stranded wire and FIG. 14 shows an $Nb_3Sn$ stranded cable conductor for electric and mechanical field magnet which has a structure internally reinforced with non-magnetic stainless steel. The Al alloy according to the present invention is used as the center portion and the covering in FIG. 13 and as the covering in FIG. 14.

According to the present invention, a high purity Al which is light in weight and excellent in electric and thermal properties at cryogenic temperature is used as a stabilizing matrix, the matrix is improved in deformation resistance without losing excellent characteristics by dispersing the fine ceramic particles in the matrix to strengthen it by mechanical alloying method whereby the composite processing of the wire material becomes easy. Furthermore, by weight-saving and enhancing the electromagnetic resistance, there is obtained improvement in stability and reliability of superconducting coils used in saddle electromagnets for magneto hydrodynamic generation, magnets for magnetically levitated trains, particle accelerators, electricity generators, magnet wires for motors, armature magnet wires, magnets for medical nuclear magnetic resonance imaging apparatuses, troidal coils for nuclear fusion apparatuses and large-sized magnets for storing energy.

What is claimed is:

1. A superconducting wire comprising:
a plurality of filaments formed of metallic superconductive material and a stabilizing matrix, said filaments being embedded in the stabilizing matrix and said stabilizing matrix comprising Al having a purity of at least 99.99% by weight in which ceramic ultrafine particles having 0.001–0.02 μm diameter distribution are dispersed, 1500 or more of said ultrafine particles being dispersed in a region of 1 μm² of said stabilizing matrix, and said stabilizing matrix containing 0.01 to 1 wt % of said ultrafine particles.

2. A superconducting wire comprising:
a plurality of filaments formed of metallic superconductive material and a stabilizing matrix, said stabilizing matrix comprising Al having a purity of at least 99.99% in which ceramic ultrafine particles having a 0.001–0.02 μm diameter distribution are dispersed, at least 1500 of said ultrafine particles being dispersed in a region of 1 μm² of said stabilizing matrix and said matrix containing 0.01–1% by weight of said ultrafine particles.

3. A superconducting wire comprising:
a plurality of filaments formed of metallic superconductive material and a stabilizing matrix, said filaments being embedded within said stabilizing matrix and said stabilizing matrix comprising Al having a purity of at least 99.99% by weight in which ceramic ultrafine particles having 0.001–0.02 μm diameter distribution are dispersed, wherein a relation between an interspacing distance between said filaments and a number of filaments in the matrix is as follows:
in a graph, an interspacing distance of said filaments is expressed on a y-axis and the number of said filaments is expressed on an x-axis, with each axis having a logarithmic scale;
on said graph, point A having the coordinates (100, 20 μm), point B having the coordinates (1000, 10 μm), point C having the coordinates (5000, 2 μm) and point D having the coordinates (5000, 2 μm) are plotted;
and points A, B, C and D are connected by linear lines in a series of A-B, B-D, D-C and C-A; said relation between the dispersing distance of said filaments and the number of said filaments being defined by an area surrounded by said linear lines; 1500 or more of said ultrafine particles being dispersed in a region of 1 μm² of said stabilizing matrix and said matrix containing 0.01–1% by weight of said ultrafine particles.

4. A superconducting wire comprising:
a plurality of filaments formed of metallic superconductive material and a stabilizing matrix, said filaments being embedded within said stabilizing matrix and said stabilizing matrix comprising Al having a purity of at least 99.99% by weight in which ceramic ultrafine particles having 0.001–0.02 μm diameter distribution are dispersed, wherein a relation between an interspacing distance of said filaments and a diameter of said filaments in the matrix is as follows:
in a graph, the interspacing distance between said filaments is expressed on a y-axis and the number of said filaments is expressed on an x-axis, with each axis having a logarithmic scale;

on said graph, point A having the coordinates (1 μm, 2 μm), point B having the coordinates (1 μm, 0.3 μm), point C having the coordinates (60 μm, 20 μm) and point D having the coordinates (60 μm, 2.5 μm) are plotted; and points A, B, C and D are connected by linear lines in a series of A-B, B-D, D-C and C-A; said relation between the interspacing distance between said filaments and the diameter of said filaments being defined by an area surrounded by said linear lines; 1500 or more of said ultrafine particles being dispersed in a region of 1 μm$^2$ of said stabilizing matrix and said matrix containing 0.01–1% by weight of said ultrafine particles.

5. A superconducting wire comprising:

a plurality of filaments formed of metallic superconductive material and a stabilizing matrix, said filaments being embedded in the stabilizing matrix and said stabilizing matrix comprising Al having a purity of at least 99.99% by weight in which ceramic ultrafine particles having 0.001–0.02 μm diameter distribution are dispersed, a yield strength of said stabilizing matrix being from 30 MPa to 400 MPa at room temperature and an elongation of said stabilizing matrix at room temperature being from 40% to 110% at a yield strength of 100 MPa or less and from 15% to 40% at a yield strength exceeding 100 MPa; 1500 or more of said ultrafine particles being dispersed in a region of 1 μm$^2$ of said stabilizing matrix and said matrix containing 0.01–1% by weight of said ultrafine particles.

6. A superconducting wire comprising:

a plurality of filaments formed of metallic superconductive material and a stabilizing matrix, said filaments being embedded within said stabilizing matrix and said stabilizing matrix comprising Al having a purity of at least 99.99% by weight in which ceramic ultrafine particles having 0.001–0.02 μm diameter distribution are dispersed, said stabilizing matrix exhibiting a tensile strength at 300° C. which decreases by no more than 20 MPa at 300° C. from the tensile strength of the matrix exhibited at room temperature; 1500 or more of said ultrafine particles being dispersed in a region of 1 μm$^2$ of said stabilizing matrix and said matrix containing 0.01–1% by weight of said ultrafine particles.

7. A composite superconductor comprising:

a plurality of superconducting wires and a housing containing said superconducting wires, each of said superconducting wires comprising a plurality of filaments formed of metallic superconductive material and a stabilizing matrix, said filaments being embedded in the stabilizing matrix and said stabilizing matrix comprising Al having a purity of at least 99.99% by weight in which ceramic ultrafine particles having 0.001–0.02 μm diameter distribution are dispersed, 1500 or more of said ultrafine particles being dispersed in a region of 1 μm$^2$ of said stabilizing matrix and said matrix containing 0.01% to 1% by weight of said ultrafine particles; said housing comprising a matrix comprising aluminum of a purity of at least 99.99% by weight in which ceramic ultrafine particles having 0.001–0.02 μm diameter distribution are dispersed.

8. A composite superconductor according to claim 7, wherein a yield strength of said housing is larger than a yield strength of the stabilizing matrix in said superconducting wires.

9. A superconducting apparatus selected among a superconducting coil of a saddle magnet for magneto hydrodynamic generation, a magnetic for magnetically levitated trains, a magnet for particle accelerators, a magnet for nuclear magnetic resonance imaging apparatus, a large-size magnet for storage of energy, a troidal coil for nuclear fusion apparatus, a field wire for generators or electric motors and an armature wire, wherein said apparatus includes at least one superconducting wire or at least one composite superconductor as defined by any one of claims 1 through 8.

10. A superconducting wire according to any one of claims 1 through 6, wherein said metallic superconductive materials comprises alloys or intermetallic compounds of at least two elements selected from the group consisting of Ti, Nb, Al, V, Ga, Ge, Zr, Hf, Mo and Re.

11. A superconducting wire according to claim 10, wherein said alloys are selected from the group consisting of Ti-Nb, Nb-Zr, Nb-Hf, V-Ti and Mo-Re alloys, said Ti-Nb alloy containing at least one of Zr, Ta and Hf and the intermetallic compounds are selected from the group consisting of Nb$_3$Al, V$_3$Ga, Nb$_3$Ga and Nb$_3$Ge.

12. A superconducting wire according to any one of claims 1 through 6, wherein said ceramic ultrafine particles are particles of at least one ceramic selected from the group consisting of Al$_2$O$_3$, ZrO$_2$, MgO, SiO$_2$, TiO$_2$, AlN, TiB$_2$, ZrO$_2$, BN, B$_4$C, β-SiC, TiC and NbC.

* * * * *